United States Patent [19]

Law et al.

[11] Patent Number: 5,399,387
[45] Date of Patent: Mar. 21, 1995

[54] PLASMA CVD OF SILICON NITRIDE THIN FILMS ON LARGE AREA GLASS SUBSTRATES AT HIGH DEPOSITION RATES

[75] Inventors: Kam S. Law, Union City; Robert Robertson, Palo Alto; Pamela Lou, San Francisco; Marc M. Kollrack, Alameda; Angela Lee, Sunnyvale; Dan Maydan, Los Altos Hills, all of Calif.

[73] Assignee: Applied Materials, Inc., Santa Clara, Calif.

[21] Appl. No.: 227,479

[22] Filed: Apr. 13, 1994

Related U.S. Application Data

[63] Continuation of Ser. No. 10,109, Jan. 28, 1993, abandoned.

[51] Int. Cl.6 ................................................ B05D 3/06
[52] U.S. Cl. ...................................... 427/574; 427/573;
427/570; 427/578; 427/579; 427/166; 427/167;
427/255.1; 427/255.2; 437/241
[58] Field of Search ............... 427/574, 573, 570, 578,
427/579, 166, 167, 255.1, 255.2; 437/241

[56] References Cited

U.S. PATENT DOCUMENTS

| 495,160 | 8/1990 | Maydan et al. |
|---|---|---|
| 4,668,365 | 5/1987 | Foster et al. ............... 204/192.23 |
| 4,704,300 | 11/1987 | Yamazaki ....................... 427/579 |
| 4,751,191 | 6/1988 | Gonsiorawski et al. ......... 437/2 |
| 4,877,641 | 10/1989 | Dory ............................. 427/579 |
| 4,892,753 | 1/1990 | Wang et al. |

FOREIGN PATENT DOCUMENTS

61-5579  1/1986  Japan.
2-40961  2/1990  Japan.

OTHER PUBLICATIONS

Wolf et al. "Silicon Processing For The VLSI ERA", vol. 1, Lattice Press, 1986, pp. 191–194.

Primary Examiner—Roy V. King
Attorney, Agent, or Firm—Birgit E. Morris

[57] ABSTRACT

High quality silicon nitride thin films can be deposited by plasma CVD onto large area glass substrates at high deposition rates by adjusting the spacing between the gas inlet manifold and substrate, maintaining the temperature at about 300°–350° C., and a pressure of at least 0.8 Torr. Subsequently deposited different thin films can also be deposited in separate chemical vapor deposition chambers which are part of a single vacuum system.

7 Claims, 1 Drawing Sheet

PLASMA CVD OF SILICON NITRIDE THIN FILMS ON LARGE AREA GLASS SUBSTRATES AT HIGH DEPOSITION RATES

This is a continuation of U.S. application Ser. No. 08/010,109, filed Jan. 28, 1993.

This invention relates to the deposition of silicon nitride thin films using chemical vapor deposition processing. More particularly, this invention relates to a process for depositing silicon nitride thin films onto large area glass substrates at high deposition rates.

BACKGROUND OF THE INVENTION

In the manufacture of liquid crystal cells, two glass plates are joined together with a layer of a liquid crystal material sandwiched between them. The glass substrates have conductive films thereon (at least one must be transparent, such as an ITO film) that can be connected to a source of power to change the orientation of the liquid crystal material. Various areas of the liquid crystal cell can be accessed by proper patterning of the conductive films. More recently, thin film transistors have been used to separately address areas of the liquid crystal cell at fast rates. Such liquid crystal cells are useful for active matrix displays such as TV and computer monitors.

As the requirements for resolution of liquid crystal monitors has increased, it has become desirable to separately address a plurality of areas of the liquid crystal cell, called pixels. Since about 1,000,000 pixels are present in modern displays, at least the same number of transistors must be formed on the glass plates so that each pixel can be separately addressed.

Different types of thin film transistors are in current use, but most require deposition of a gate dielectric layer over a patterned gate metal with an amorphous silicon layer thereover. The gate dielectric layer can be made from various combinations of silicon oxide, silicon nitride and metal oxide layers. For example, the metal contact can be covered with one or more layers of tantalum oxide, aluminum oxide or silicon oxide, and a final layer of high quality gate dielectric. Silicon nitride is usually the gate dielectric layer; it can also be used alone. Metal contacts are deposited thereafter over the amorphous silicon films, which can have a doped amorphous silicon layer thereover to improve contact between the amorphous silicon and the overlying metal contacts. A second silicon nitride film is deposited over the amorphous silicon layer as an etch stop in some transistor designs.

Up till now, thin silicon nitride films have had adequate quality for use in thin film transistors; however, the deposition rate has been quite slow. Thus it would be highly desirable to be able to deposit silicon nitride films at increased deposition rates while maintaining high quality films.

SUMMARY OF THE INVENTION

We have found that high quality silicon nitride thin films can be deposited in a CVD chamber under certain conditions that increase the deposition rates while maintaining high quality films. By operating at pressures higher than those used in prior art processes, and by optimizing the deposition parameters, including the gas flows, RF power, electrode spacing and temperature, high deposition rates of high quality silicon nitride thin films can be obtained.

DETAILED DESCRIPTION OF THE INVENTION

We have found that we can deposit silicon nitride thin films over large area glass substrates having preformed gate metal areas deposited thereon at high deposition rates by proper choice of deposition parameters, as will be further illustrated hereinbelow.

U.S. Pat. 4,892,753 to Wang et al, incorporated herein by reference, describes a plasma enhanced CVD reactor having features suitable for carrying out the present CVD process. Although the reactor of this reference is described in terms of processing semiconductor wafers, suitable adjustments of size will accommodate the present large area glass substrates.

The reactor useful herein will be further described with reference to FIG. 1.

Figure 1:
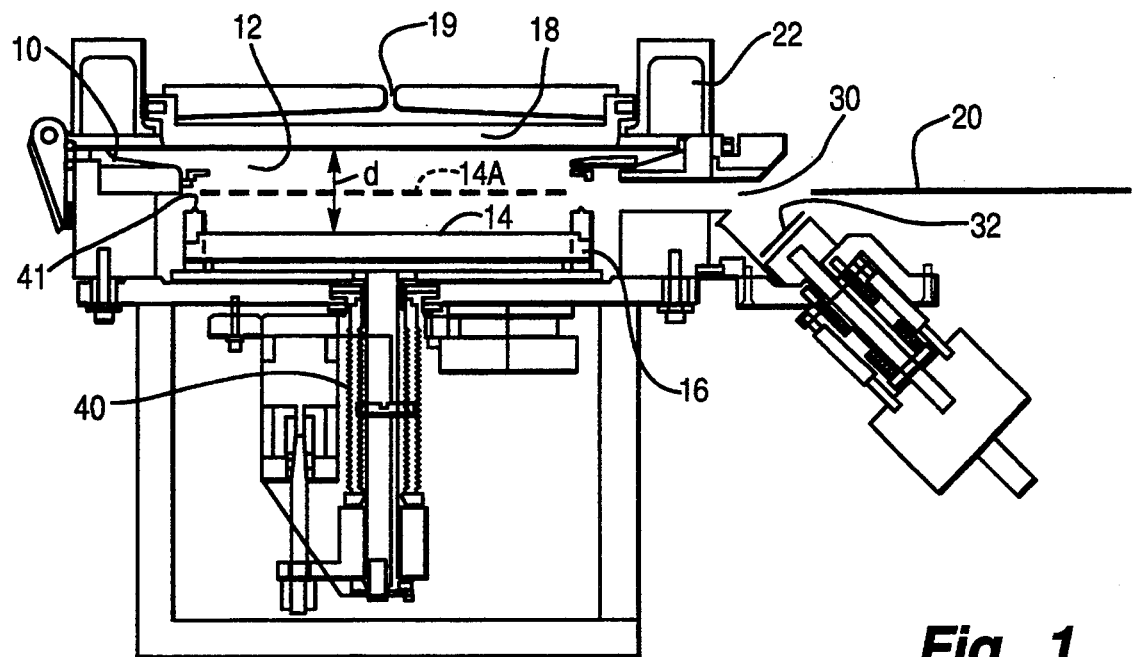
FIG. 1 is a cross sectional view of a CVD reactor useful for deposition of thin silicon nitride films on large area glass substrates.

FIG. 1 is a cross sectional view of a vacuum chamber 10, typically made of aluminum, that has a reaction region 12. A substrate 14 is supported on a suitable support or susceptor 16 that can be heated, as by a resistive heater embedded in the susceptor. Above the substrate 14 is a gas manifold plate 18 which supplies the precursor reaction gases, carrier gases and purge gases from a gas inlet 19 to the reaction region 12. The spacing -d- between the substrate 14 and the gas manifold 18 is adjustable by an elevator assembly 40. The ability to adjust the gas manifold-substrate spacing enables the process to be optimized over a wide range of deposition conditions, while maintaining the required film uniformity over the area of a large glass substrate. The spacing -d- between the substrate 14 and the gas manifold plate 18 is typically maintained at about one inch.

The elevator assembly 40 has a dual function. When a substrate 14 is transferred into the chamber 10 by means of a substrate support arm 20 operated by a robot in an adjacent chamber (not shown) the position of the substrate 14 in the chamber 10 initially is shown by the dotted line 14A. At that time the lift pins 41 are raised to support the substrate. The elevator assembly 40 then raises the susceptor and the substrate 14 to the processing position. A closable opening 30 is opened to allow entry and exit of the substrate 14 by the robot support arm 20. During processing, the closable openings 30 is closed by means of a piston driven slit valve 32.

The gas manifold plate 18 is a plate having a plurality of openings therethrough uniformly distributed over the plate 18. The manifold plate 18 useful herein has about 10,000 openings in the plate which is about the same overall area as the substrate 14, about 360×450.

The gas manifold plate 18 is part of a gas distribution system that flows the process gases across the substrate 14 and radially outwardly to the edges of the substrate and beyond, where they are removed by evacuation port 22. A shield or shadowframe 24 prevents deposition onto the edges of the substrate 14.

The temperature of the gas manifold 18 is regulated so as to minimize deposition of the solid products of the reaction onto the gas manifold 18.

An RF power supply and matching network (not shown) create and sustain a plasma of the process gases from the precursor gases in the reaction region 12. Preferably high frequency RF power of 13.56 MHz can be used, but this is not critical and lower frequencies can also be used. Further, the gas manifold plate 18 is RF driven, while the susceptor or substrate support 16 is grounded. The walls of the chamber can be protected by covering with a ceramic material. The combination of a grounded susceptor, a ceramic liner, high pressures and close manifold-substrate spacing gives a high degree of plasma confinement between the gas manifold plate 18 and the support 16, thereby increasing the concentration of reactive species and the deposition rate of the subject thin films.

By maintaining the spacing -d- between the gas manifold plate and the substrate relatively small, the chamber itself can be made smaller and the deposition processes are more controllable, e.g., the reactive species are more closely confined, therefor denser; further, the small volume of the reaction region 12 allows rapid changes of gas components in the reaction region 12 and contaminants and purge gases can be rapidly removed and replaced for a subsequent deposition.

Gate dielectric silicon nitride films must be of high quality to be useful in forming thin film transistors on glass substrates. The quality of gate dielectric silicon nitride films is measured by the wet etch rate using a 6:1 buffered HF solution, the Si—H bond content and the surface morphology. In order to be useful for the present application, the silicon nitride film must have a wet etch rate of about 100–500 angstroms/min, an Si—H content of $8 \times 10^{21}$ cm$^{-3}$ or less, and a surface root mean squared roughness of 1.6 nm or less for a 4000 angstrom thick film.

A high quality gate dielectric silicon nitride film must also produce good transistor electrical characteristics, such as electron mobility and threshold voltage. In accordance with the process of the invention, such high quality silicon nitride films can be made at deposition rates of up to 2000–3000 angstroms/min, which was highly unexpected. These rates are achievable by maintaining the pressure in the CVD chamber at between about 0.8–2.0 Torr, and the temperature of the substrate at about 300°–350° C. during deposition. In addition precursor gas flow rates are regulated to maintain adequate reaction gas levels. Suitable silane (100 to 500 sccm) and ammonia (500 to 2000 sccm) gas flow levels are employed in a carrier gas of nitrogen (1000 to 20,000 sccm).

The temperature of the glass plates must be high enough for efficient deposition but must be maintained below about 450° C. when the large area glass substrates may warp. In general a deposition temperature of from about 300°–350° C. is maintained during deposition.

The pressure of the present deposition process is somewhat higher than prior art processes, which we believe contributes to the high deposition rates obtained herein. In general, the pressure in the reaction chamber should be maintained above about 0.8 Torr and is preferably maintained at about 1–2.0 Torr. In any event, thin films of silicon nitride deposited at the above temperature and pressure, and in the above-described variable spacing CVD reactor, results in deposition rates of about 1000–3000 angstroms per minute as contrasted to deposition rates of about 100–300 angstroms/min for prior art processes and reactors, an order of magnitude improvement in deposition rate.

The thickness of the deposited silicon nitride layer is variable, depending on the nature of the underlying and overlying layers. For example, when a silicon oxide gate dielectric layer is deposited over a patterned metal film, only a thin silicon nitride layer, about 500–1000 angstroms thick, is deposited. However, if no gate silicon oxide is present, the silicon nitride dielectric layer should be about 2500–3500 angstroms thick. Silicon nitride can also be deposited over amorphous silicon as part of a transistor as an etch stop. In such case the silicon nitride layer is about 2000–3000 angstroms thick.

The present invention will be further illustrated in the following examples, but the invention is not meant to be limited to the details described therein.

EXAMPLE 1

Glass substrates $360 \times 450 \times 1.1$ mm thick having a preselected pattern of gate metal pads deposited thereon in an array and having a layer of silicon oxide about 2500 angstroms thick thereover was brought under vacuum and into the CVD chamber. The substrate was heated to 330° C. under flowing nitrogen and then silicon nitride was deposited under the following conditions:

| | |
|---|---|
| SiH$_4$ | 110 sccm |
| NH$_3$ | 550 sccm |
| N$_2$ | 3900 sccm |
| Power | 600 Watts |
| Pressure | 1.2 Torr |
| Spacing | 1000 mils |
| Susceptor Temperature | 397° C. |
| Substrate Temperature | 330° C. |

The rate of deposition was 930 angstroms/min and a layer about 500 angstroms thick was deposited in about 32 seconds. This layer had a refractive index of 1.91, a compressive stress of $-4.9 \times 10^9$ dynes/cm$^2$, a wet etch rate of 360 angstroms/min in 6:1 buffered HF solution, and a root mean squared surface roughness of 1.1 nm, all of which are indicative that a good quality gate dielectric silicon nitride was deposited.

Transistors made with this film had electrical characteristics that were comparable to those achieved with prior art deposition equipment.

EXAMPLE 2

In this Example 3000 angstroms of gate dielectric silicon nitride was deposited directly on the gate metal using the following deposition conditions:

| | |
|---|---|
| SiH$_4$ | 165 sccm |
| NH$_3$ | 825 sccm |
| N$_2$ | 3300 sccm |
| Power | 1300 Watts |
| Pressure | 1.5 Torr |
| Spacing | 1200 mils |
| Susceptor Temperature | 385° C. |
| Substrate Temperature | 330° C. |

The deposition rate was 1860 angstroms/min. Thus increasing gas flow rates and increasing the pressure and the power increased the deposition rate. However, even when the deposition rate was increased by a factor of two, high quality silicon nitride films were obtained.

The above layer had a refractive index of 1.89, a compressive stress of $-55 \times 10^9$ dynes/cm$_2$, a wet etch rate of 150 angstroms/min in 6:1 buffered HF solution, and a root mean squared surface roughness of 1.6 nm. The Si—H bond content was about $3 \times 10^{21}$ cm$^{-3}$.

Thin film transistors made with this high deposition rate film again had electrical characteristics comparable to those achieved with prior art deposition equipment.

The above-described CVD process can be utilized in systems known for multi-step processing of semiconductor substrates, such as is disclosed by Maydan et al in U.S. Pat. 4,951,601 or in vacuum systems designed to deposit multiple layers onto large area glass substrates for the manufacture of thin film transistors, as described in commonly assigned copending applications of Norman Turner et al entitled "VACUUM PROCESSING APPARATUS HAVING IMPROVED THROUGHPUT" Ser. No. 08/010,684 filed Jan. 28,1993 and "METHOD OF HEATING AND COOLING LARGE AREA GLASS PLATES AND APPARATUS THEREFOR" Ser. No. 08/010,683 filed Jan. 28, 1993 filed concurrently herewith and incorporated herein by reference.

Figure 2:
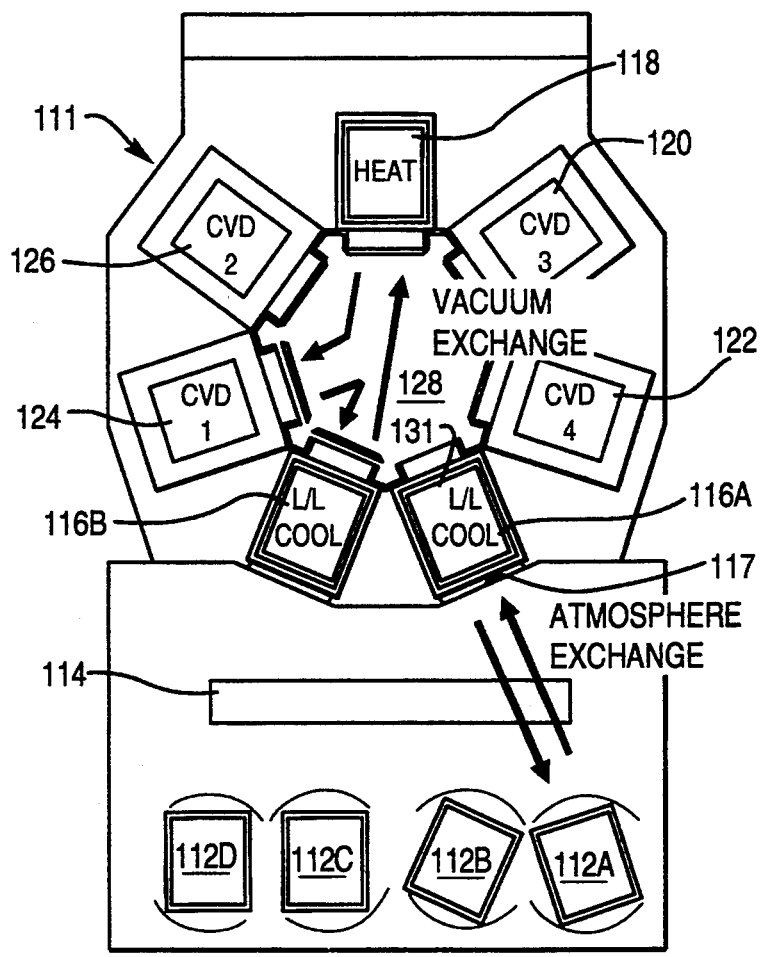
FIG. 2 is a plan view of a vacuum system for processing glass substrates including the CVD reactor of FIG. 1.

FIG. 2 is a plan view of a vacuum system for deposition of multiple films onto large area glass substrates.

Referring now to FIG. 2, a deposition system 111 comprises a series of chambers for deposition of a plurality of thin films on large area glass substrates. Cassettes 112A, 112B, 112C and 112D contain a plurality of shelves for the storage of large glass substrates thereon. A robot 114 is used to transfer the glass substrates one at a time from the cassettes 112 into one or two combination cooling and load lock chambers 116A and 116B through a closable opening 117 to atmosphere. The system 100 also includes a heating chamber 118 to bring the glass substrates up to deposition temperatures. A series of four CVD chambers 120, 122, 124 and 126, together with the two cooling/load lock chambers 116 and a heating chamber 118 define between them a vacuum transfer chamber 128. The cooling/load lock chambers 116A and 116B and the heating chamber 118 hold cassettes which are mounted on an elevator assembly (not shown) that can be indexed vertically. These heating and cooling cassettes have thermally conductive shelves therein for supporting the glass substrates while they are being heated or cooled.

After the robot 114 transfers a glass substrate from a cassette 112 into a cassette of the cooling/load lock chamber 116A, the elevator assembly raises (or lowers) the cassette by the height of one shelf, when another glass substrate is transferred to the cooling chamber cassette 116A by the robot 114. When all of the shelves in the cassette of the chamber 116A have been filled, the closable opening 117 is closed and the chamber 116A is evacuated. When the desired pressure is reached, a closable opening 131 adjacent the transfer chamber 128 is opened. A transfer robot (not shown) transfers all of the glass substrates from the cooling/load lock chamber 116A to a cassette in the heating chamber 118, where the glass substrates are heated to near deposition temperatures. The cassette in the heating chamber 118 and the cooling chamber cassette 116A are raised or lowered after each transfer to present a different shelf to the transfer robot in the transfer chamber 128.

When the glass substrates have reached deposition temperature, the transfer robot transfers a glass plate to one or more of the CVD chambers 120, 122, 124 or 126 sequentially in a preselected order. For example, a first thin film of silicon nitride may be deposited in CVD chamber 120; a second thin film of amorphous silicon may be deposited in CVD chamber 122; a third thin films of doped amorphous silicon may be deposited in CVD chamber 124. When all of the preselected depositions have been made, the transfer robot transfers the processed glass substrates back to the cassette of the cooling/load lock chamber 116A. The closable opening 131 is closed when all of the shelves in the cooling/load lock chamber 116A have been filled. Concurrently, the robot 114 has transferred another batch of glass substrates from a different cassette 112C to a cassette in the cooling/load lock chamber 116B which is evacuated when loading is complete.

When all of the processed glass substrates in the cooling/load lock chamber 116A have been cooled to below about 150°, the chamber 116A is brought to ambient pressure, the closable opening 117 is opened and the robot 114 unloads the now processed and cooled glass substrates back to a cassette 112.

Thus the system 100 is built for continuous operation. The combination of batch heating and cooling of glass substrates, an operation that takes a relatively long period of time, e.g., several minutes, and single substrate CVD processing of thin films, which takes a comparatively short time, e.g., less than one minute, maximizes the throughput and efficiency of the system 100.

Although the invention has been described in accordance with certain embodiments and examples, the invention is not meant to be limited thereto. The CVD process herein can be carried out using other CVD chambers, adjusting the gas flow rates, pressure and temperature so as to obtain high quality films at practical deposition rates. The invention is meant to be limited only by the scope of the appended claims.

We claim:

1. A plasma assisted chemical vapor deposition process comprising
    depositing a dielectric silicon nitride film from a plasma of a precursor gas comprising silane and ammonia onto a single substrate at a temperature of below about 450° C. and a pressure of at least about 0.8 Torr in a vacuum chamber wherein the spacing between the gas inlet manifold and the substrate is adjusted so that the silicon nitride deposition rate is maximized.

2. A deposition process according to claim 1 wherein said precursor gas also includes a carrier gas of nitrogen.

3. A deposition process according to claim 1 wherein the pressure is maintained at about 0.8–2.0 Torr.

4. A deposition process according to claim 1 wherein said substrate is glass.

5. A deposition process according to claim 1 wherein said silicon nitride is deposited as a gate dielectric layer over a patterned gate layer.

6. A deposition process according to claim 1 wherein said silicon nitride is deposited as a gate dielectric layer over a patterned gate layer on a glass substrate.

7. A deposition process according to claim 1 wherein the temperature is maintained below about 350° C.

* * * * *